United States Patent [19]
Hanks

[11] Patent Number: 5,769,669
[45] Date of Patent: Jun. 23, 1998

[54] APPARATUS AND METHOD FOR KEYING AN ELECTRICAL ASSEMBLY WITH A WIRING BACKPLANE

[75] Inventor: D'Anne Beukelaer Hanks, Santa Rosa, Calif.

[73] Assignee: DSC Telecom L.P., Plano, Tex.

[21] Appl. No.: 702,985

[22] Filed: Aug. 26, 1996

[51] Int. Cl.$^6$ .................................................. H01R 13/64
[52] U.S. Cl. ............................................................ 439/681
[58] Field of Search ................................... 439/680, 681, 439/633; 361/785, 786, 788

[56] References Cited

U.S. PATENT DOCUMENTS

| | | | |
|---|---|---|---|
| 3,404,362 | 10/1968 | Amendola | 339/17 |
| 3,474,395 | 10/1969 | Ferdon et al. | 339/186 |
| 4,568,134 | 2/1986 | DiMondi | 339/17 LC |
| 4,925,400 | 5/1990 | Blair et al. | 439/374 |
| 4,952,175 | 8/1990 | Waters et al. | 439/681 |
| 5,000,701 | 3/1991 | Norden | 439/680 |
| 5,066,250 | 11/1991 | Welsh | 439/681 |
| 5,125,849 | 6/1992 | Briggs et al. | 439/378 |
| 5,178,561 | 1/1993 | Lindeberg et al. | 439/571 |
| 5,387,132 | 2/1995 | Sarver et al. | 439/633 |
| 5,392,194 | 2/1995 | Zell et al. | 361/785 |
| 5,486,116 | 1/1996 | Meiler et al. | 439/347 |

FOREIGN PATENT DOCUMENTS

| | | | |
|---|---|---|---|
| 439994A | 2/1992 | Japan | 439/680 |

*Primary Examiner*—Gary F. Paumen
*Assistant Examiner*—Yon g Ki Kim
*Attorney, Agent, or Firm*—Baker & Botts, L.L.P.

[57] ABSTRACT

An apparatus and method for keying an electrical assembly with a wiring backplane include an electrical assembly (1), a removable guide member (3), and a wiring backplane (8). The removable guide member (3) has a projection (7) perpendicular to the body (4) of the removable guide member (3) which is secured to the electrical assembly (1) by a flexible latching element (11). The electrical assembly (1) having a removable guide member (3) is received by a wiring backplane (8) adapted to receive the removable guide member (3).

5 Claims, 3 Drawing Sheets

APPARATUS AND METHOD FOR KEYING AN ELECTRICAL ASSEMBLY WITH A WIRING BACKPLANE

TECHNICAL FIELD OF THE INVENTION

This invention relates in general to electrical assemblies, and more particularly to an apparatus and method for keying an electrical assembly with a wiring backplane.

BACKGROUND OF THE INVENTION

Several known devices use keying or guide systems directed toward electrical board assemblies. However, many of these known devices are attached to the assembly connector or are integrated into the connector and used as part of the electrical circuitry to prevent electrostatic discharge. Thus, errors in connector keying or limitations in the number of possible connector keying combinations may still result in circuit incompatibility. Therefore, it is desirable to have a simple and efficient keying system in order to prevent erroneous circuit operation or damage to the circuitry of an electrical assembly.

Some known devices have attempted to provide a keying system separate and apart from the assembly connector, but these systems may require installing additional hardware to the wiring backplane and electric circuit board. Additionally, these types of keying systems, as well as connector-type keying systems, require extensive record-keeping regarding the types and configurations of pins used and their respective keying orientation for subsequent modification or replacement.

SUMMARY OF THE INVENTION

From the foregoing, it may be appreciated that a need has arisen for an electrical assembly keying device and method that are simple, easy to install and modify, take up a minimal amount of space, and can be used independently from the electrical connectors. In accordance with the present invention, an electrical assembly keying method and device are provided that substantially eliminates or reduces disadvantages and problems associated with other types of keying devices and methods.

According to an embodiment of the present invention, there is provided an electrical assembly containing an opening. A guide member is provided with a body having first and second ends. The first end of the guide member body has a projection perpendicular to the body. The projection is designed to cooperate with the electrical assembly opening for securing the guide member to the electrical assembly. A wiring backplane is provided and designed to receive the second end of the body of the guide member. The electrical assembly with the secured guide member will cooperate only with a wiring backplane that has been adapted to receive the second end of the guide member.

The present invention provides various technical advantages. For example, one technical advantage is the simpleness and ease of installation of the keying device. Another advantage is the ability to limit the types and number of different connectors and hardware attached to the circuit board and wiring backplane while still providing a keying system preventing erroneous circuit connections. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
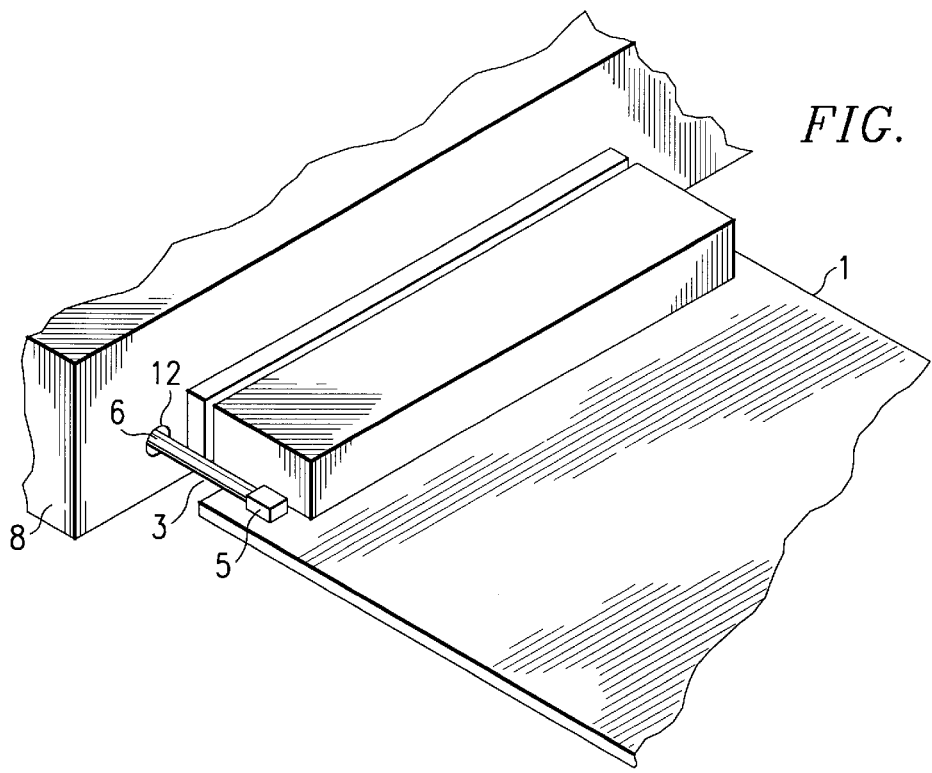
FIG. 1 is a perspective view of a first illustrative embodiment of a guide member.
Figure 2:
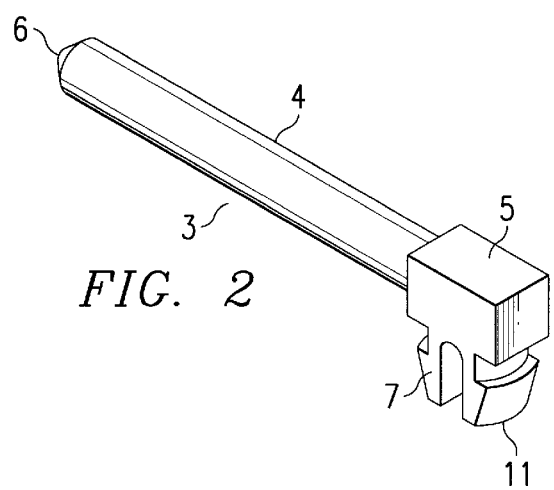
FIG. 2 is a close-up view of the guide member.
Figure 3:
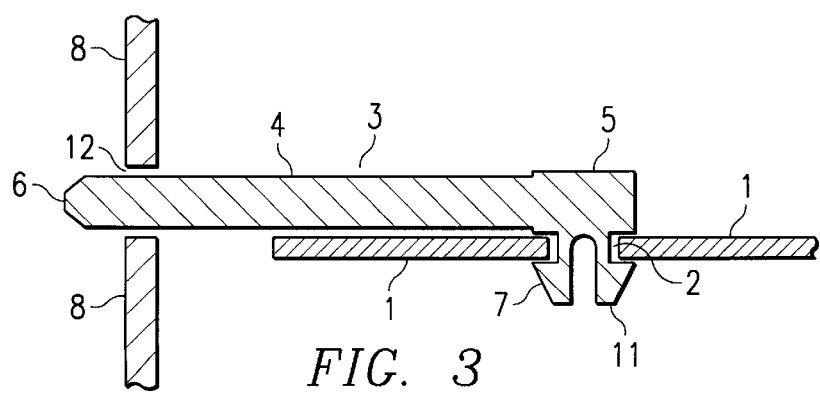
FIG. 3 is a sectional view of the guide member.

Referring now to FIGS. 1, 2, and 3 where there is shown one embodiment of the electrical assembly keying invention. There is shown an electrical assembly 1 having a first opening 2. A guide member 3 has a body 4 with a first end 5 and a second end 6. The first end 5 has a first projection 7 extending perpendicular to the body 4. The first projection 7 is designed to be received by the first opening 2 of the electrical assembly 1 and operable to secure the guide member 3 to the electrical assembly 1. Although the embodiment illustrated shows a first projection 7 having a latch element 11, any method of securing the guide member 3 to the electrical assembly 1 may be used. A wiring backplane 8 is designed to receive the second end 6 of the guide member 3. The embodiment illustrated shows a wiring backplane 8 adapted to receive the second end 6 of the guide member 3 by the use of a hole 12. The wiring backplane 8 may also be adapted to receive the second end 6 of the guide member 3 by coordinating any number of possible guide member 3 configurations with the wiring backplane 8. In operation, an electrical assembly 1 with a secured guide member 3 will be received only by a wiring backplane 8 adapted to receive the second end 6 of the guide member 3.

Figure 4:
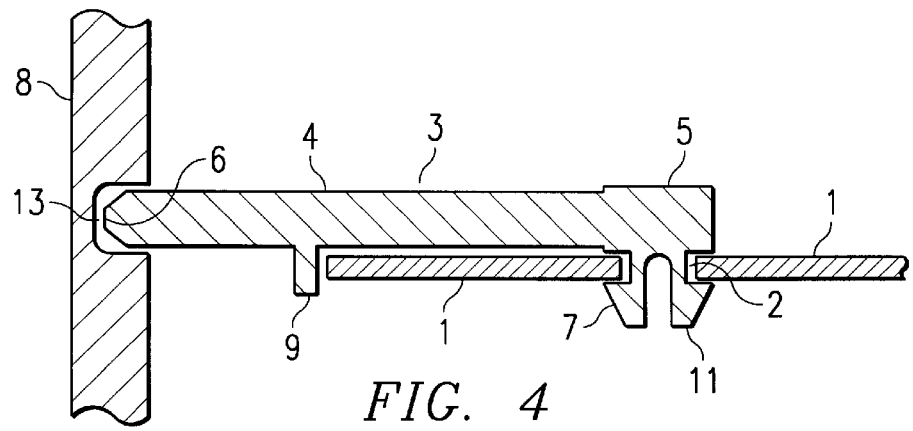
FIG. 4 is a sectional view depicting an alternate embodiment of the guide member.

FIG. 4 illustrates an alternative embodiment of the invention where the guide member 3 has a second projection 9 extending perpendicular to the body 4 and parallel to the first projection 7. The first projection 7 is designed to be received by the first opening 2 of the electrical assembly 1. The first opening 2 receives the first projection 7 and is thereby used to secure the guide member 3 to the electrical assembly 1. The second projection 9 is positioned on the body 4 of the guide member 3 to align the body 4 of the guide member 3 with the wiring backplane 8. In the depicted embodiment, the second projection 9 aligns the body 4 of the guide member 3 with the wiring backplane 8 by using the edge of the electrical assembly 1 to prevent excessive rotation of the guide member 3. Also, the embodiment illustrated shows a wiring backplane 8 adapted to receive the second end 6 of the guide member 3 by the use of a cavity 13 in the wiring backplane 8.

Figure 5:
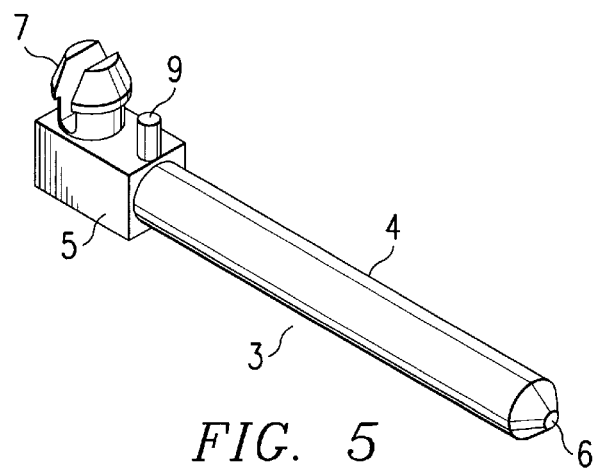
FIG. 5 is a perspective view depicting an additional alternate embodiment of the guide member.
Figure 6:
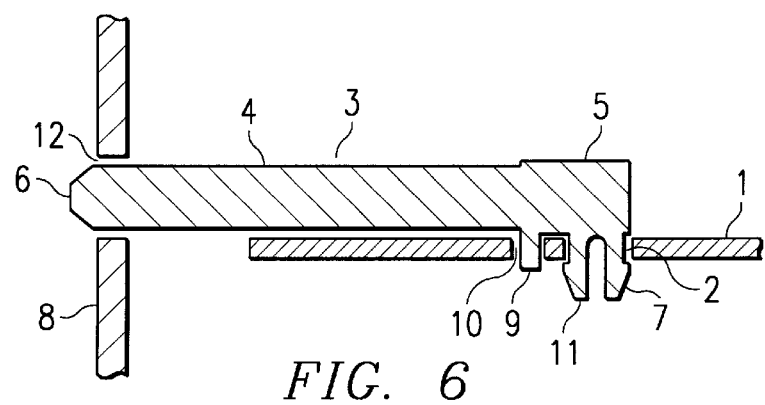
FIG. 6 is a sectional view depicting the additional embodiment of the guide member.
Figure 7:
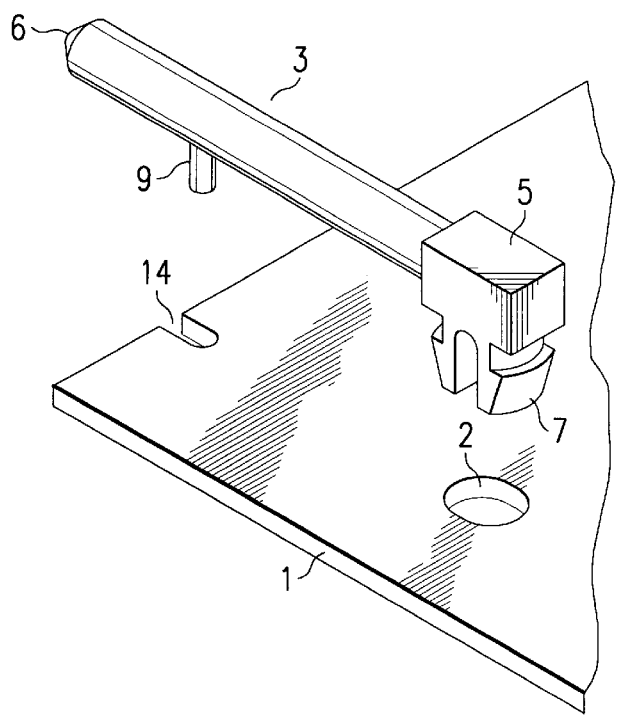
FIG. 7 is a perspective view of the additional alternate embodiment of the guide member with modification.

FIGS. 5 and 6 illustrate an alternative embodiment of the invention. The electrical assembly 1 has a first opening 2 and a second opening 10. The guide member 3 has a first projection 7 and a second projection 9 perpendicular to the body 4. The first projection 7 is parallel to the second projection 9. The first projection 7 is designed to be received by the first opening 2 of the electrical assembly 1. The first opening 2 receives the first projection 7 and is thereby used to secure the guide member 3 to the electrical assembly 1. The second projection 9 is designed to be received by the second opening 10 and cooperates with the second opening 10 to align the body 4 of the guide member 3 with the wiring backplane 8. The second projection 9 and the second opening 10 may be located anywhere along the body 4 of the guide member 3 and can be coordinated with different body 4 diameters or shapes to increase the number of possible keying combinations. FIG. 7 illustrates the second opening 10 located on the edge of the electrical assembly 1 in the form of a slot 14 to cooperate with the second projection 9 in aligning the body 4 of the guide member 3 with the wiring backplane 8.

Figure 8:
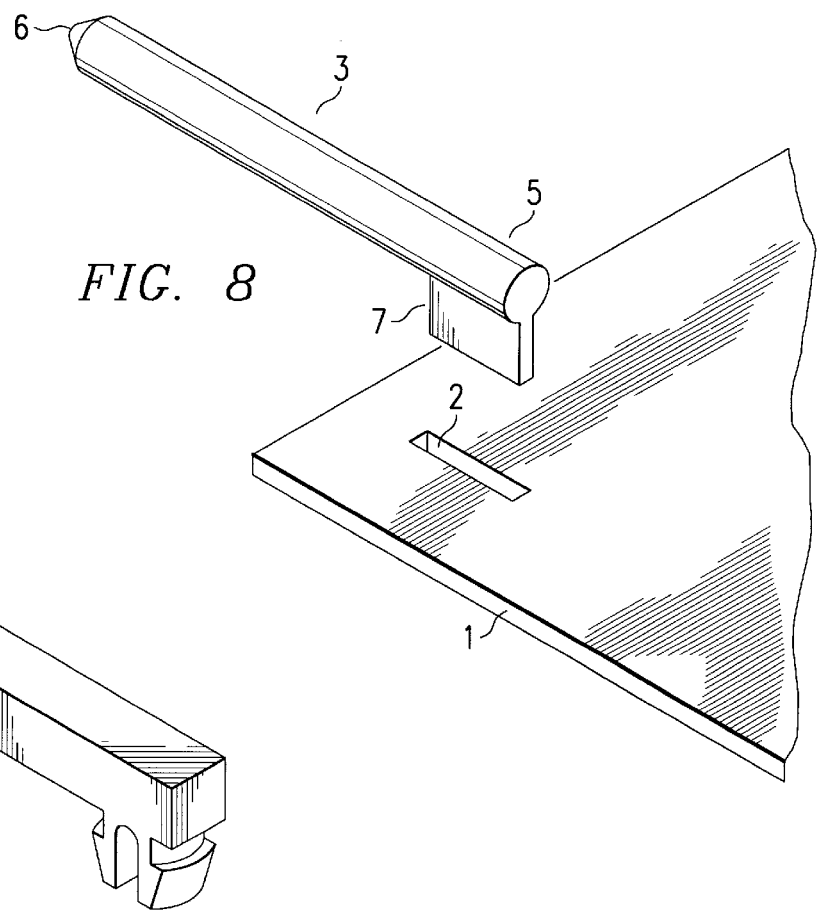
FIG. 8 is a perspective view of another alternate embodiment of the guide member.
Figure 9:
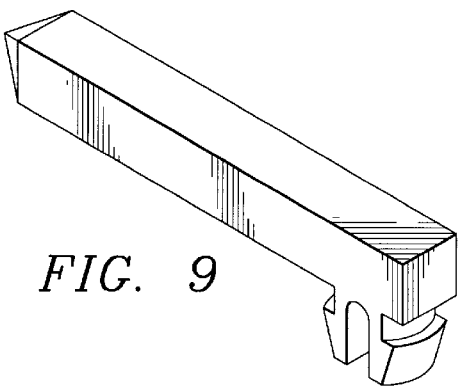
FIG. 9 is a perspective view depicting yet another alternate embodiment of the guide member.

FIGS. 8 and 9 illustrate additional embodiments of the invention. In FIG. 8, the first opening 2 of the electrical assembly 1 is of rectangular cross section and cooperates with the first projection 7 of the guide member 3 also of rectangular cross section. The non-circular cross section of the first projection 7 and first opening 2 in the electrical assembly 1 prevents excessive rotation of the guide member 3 and is operable to align the body 4 of the guide member 3 with the wiring backplane 8. Though not shown, first projection 7 may have a latch element similar to latch element 11 in order to secure guide member 3 to electrical assembly 1. FIG. 9 illustrates a guide member 3 with a non-circular body 4 to prevent rotation and allow for a combination of keying devices.

It should also be noted that, although one guide member 3 is shown in the drawings, other similar members can be located elsewhere along the electrical assembly 1 to increase the number of keying combinations. Also, the geometric shape and size of the guide member 3 can be varied to increase the number of possible keying combinations.

Guide member 3 may be constructed out of a variety of materials, including plastics, and may be made by a variety of techniques, including injection molding. Preferably, guide member 3 is made out of nylon 6/6 having a 94VO UL rating for electronic equipment. This provides a safe, nonflammable, and cost effective device for providing a viable keying apparatus.

Thus, it is apparent that there has been provided, in accordance with the present invention, a guide member that satisfies the advantages set forth above. Although the present invention has been described in detail, various changes, substitutions, and alterations can be made herein. For example, though described with regard to electrical assemblies and backplanes, the present invention is not limited thereto and may be used for a variety of keying and aligning applications. Other examples are readily ascertainable by one skilled in the art and may be made without departing from the spirit and scope of the present invention as defined by the following claims.

What is claimed is:

1. An apparatus for keying an electrical assembly with a wiring backplane comprising:

a removable guide member not adapted to have electrical contacts therein, the removable guide member having a body, the body having a first projection extending perpendicular to the body and operable to be received by a first opening in the electrical assembly, the first projection operable to couple the removable guide member to the electrical assembly, the body having a second projection extending parallel to the body; the wiring backplane operable to receive the second projection of the removable guide member, wherein the second projection has a third projection extending perpendicular to the second projection and parallel to the first projection, the third projection operable to align the removable guide member on the electrical assembly, the third projection operable to extend beyond an edge of the electrical assembly.

2. The apparatus of claim 1, wherein the first projection includes a flexible latch element to allow the removable guide member to be securely inserted into and removed from the first opening of the electrical assembly.

3. The apparatus of claim 1, wherein the wiring backplane contains a hole operable to receive the second projection of the removable guide member.

4. The apparatus of claim 1, wherein the wiring backplane includes a slot operable to receive the second projection of the removable guide member.

5. An apparatus for keying an electrical assembly with a wiring backplane comprising:

the electrical assembly having a first opening;

a removable guide member not adapted to have electrical contacts therein, the removable guide member having a body with first and second ends, the first end having a first projection perpendicular to the body adapted to be received by the first opening, the first projection operable to couple the removable guide member to the electrical assembly;

the wiring backplane adapted to receive the second end of the removable guide member, wherein:

the electrical assembly has a second opening, the removable guide member has a second projection perpendicular to the body and parallel to the first projection operable to align the removable guide member on the electrical assembly, the second projection adapted to be received by the second opening, wherein the second opening is a slot located on the edge of the electrical assembly.

* * * * *